United States Patent

[11] 3,600,649

[72] Inventors Shing-Gong Liu
Princeton;
John Joseph Risko, Cranbury, both of, N.J.

[21] Appl. No. 832,654
[22] Filed June 12, 1969
[45] Patented Aug. 17, 1971
[73] Assignee RCA Corporation

[54] HIGH POWER AVALANCHE DIODE
5 Claims, 10 Drawing Figs.

[52] U.S. Cl. .......... 317/235 R, 317/234 R, 317/235 T, 317/235 AD, 317/235 AM, 317/235 AN, 148/175, 148/186
[51] Int. Cl. .......... H01l 5/00
[50] Field of Search .......... 317/235, 30, 48.1, 48.2

[56] References Cited

UNITED STATES PATENTS

| | | | |
|---|---|---|---|
| 3,421,057 | 1/1969 | Bilous et al. .......... | 317/235 |
| 3,351,828 | 11/1967 | Beale et al. .......... | 317/235 |
| 3,244,566 | 4/1966 | Mann et al. .......... | 148/186 |

*Primary Examiner*—John W. Huckert
*Assistant Examiner*—B. Estrin
*Attorney*—Glenn H. Bruestle

ABSTRACT: A high power avalanche diode includes a substrate of N+-type semiconductor material having an epitaxial layer of a semiconductor material on a surface thereof. The epitaxial layer includes an N-type region adjacent the surface of the substrate and a P-type region over the N-type region forming a PN junction therebetween. The N-type region is at least 3 microns thick and is of uniform carrier concentration. The P-type region has a graded carrier concentration which increases from the PN junction to the surface of the epitaxial layer.

The avalanche diode is made by epitaxially forming a layer of N-type semiconductor material on the surface of a substrate of N+-type semiconductor material. A source of P-type dopant material is provided on the surface of the epitaxial layer. The P-type dopant material is diffused into the epitaxial layer to a distance which is spaced from the substrate not less than 3 microns and so as to provide the graded carrier concentration in the resultant P-type region.

INVENTORS
SHING-GONG LIU AND
JOHN JOSEPH RISKO

BY [signature]
Attorney

INVENTORS
SHING-GONG LIU AND
JOHN JOSEPH RISKO

BY Donald S. Cohen
Attorney

HIGH POWER AVALANCHE DIODE

BACKGROUND OF INVENTION

The present invention relates to a high power avalanche diode and methods of making the same.

Recently there has been developed avalanche diodes which can generate power many times the power of tunnel diodes or transistors and at high efficiency. Such avalanche diodes, generally referred to as "anomalous" mode diodes, have been found capable of generating RF power of 100 watts with efficiencies of 25 percent to 40 percent at L-band frequency. Although these anomalous mode avalanche diodes generate high powers at high efficiencies at L-band frequency, it would be desirable to have such a diode which would also have improved power and efficiency over standard avalanche diodes at even high frequencies, such as S-band and C-band. Also, it would be desirable to have a method of making such anomalous mode avalanche diodes which would consistently produce such improved diodes.

SUMMARY OF INVENTION

A high power avalanche diode including a substrate of N+-type semiconductor material of high carrier concentration having an epitaxial layer of a semiconductor material of at least 6 microns thick on a surface thereof. The epitaxial layer has therein a P-type region and an N-type region forming a PN junction therebetween with the N-type region being adjacent the surface of the substrate. The N-type region is at least 3 microns thick and is of a uniform low carrier concentration. The P-type region has a carrier concentration which increases from the PN junction to the surface of the epitaxial layer according to the expression $$C=Co \operatorname{erfc} \frac{X}{2\sqrt{Dt}}$$

where $C$ is the carrier concentration of the N-type region and is between $7\times10^{14}$cm.$^{13}$ and $1\times10^{15}$cm.$^{13}$.

$Co$ is the P-type carrier concentration at the surface of the epitaxial layer $X$ is the depth of the P-type region $D$ is the diffusion coefficient of the P-type dopant material $t$ is the time of the diffusion of the P-type dopant material, and $$\frac{X}{2\sqrt{Dt}} \text{ is between 1.8 and 3.1}$$

The high power avalanche diode is made by epitaxially forming a layer which is at least 6 microns thick of N-type semiconductor material of relatively uniform low carriers concentration on a surface of a substrate of N+-type semiconductor material of high carrier concentration. A source of P-type dopant material is provided on the surface of the epitaxial layer. The P-type dopant material is diffused into the epitaxial layer to provide a P-type region having a PN junction with the N-type material which junction is spaced from the substrate a distance of not less than 3 microns and with the carrier concentration in the P-type region increasing from the PN junction to the surface of the epitaxial layer according to the expression given above.

DETAILED DESCRIPTION

Figure 1:
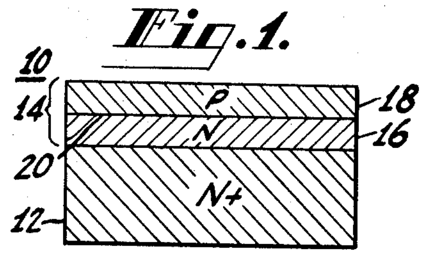
FIG. 1 is cross-sectional view of an embodiment of the avalanche diode of the present invention.

Referring initially to FIG. 1, an embodiment of the avalanche diode of the present invention is generally designated as 10. Diode 10 comprises a substrate 12 of N+-type semiconductor material, such as silicon or germanium, and epitaxial layer 14 of the same semiconductor material on a surface of the substrate 12. The epitaxial layer 14 has a region 16 of N-type conductivity adjacent the surface of the substrate 12, and a region 18 of P-type conductivity on the N-type region 16. The N-type region 16 and the P-type region 18 provide a PN junction 20 therebetween.

The substrate 12 is of a semiconductor material having a relatively high carrier concentration, approximately $10^{18}$cm.$^{13}$, and is preferably of a thickness of between 2 to 5 mils. The N-type region 16 is of a uniform low carrier concentration, approximately $7\times10^{14}$cm.$^{13}$, and is of a thickness of 3 to 8 microns.

However, the carrier concentration in thin portion of the N-type region 16 adjacent the surface of the substrate 12, a portion approximately 2 to 4 microns thick, is graded to the carrier concentration of the N+ substrate. The P-type region 18 has a carrier concentration which is graded from that of the N-type region 16 at the PN junction 20 and increases to the surface of the epitaxial layer 14 according to the expression $$C=Co \operatorname{erfc} \frac{X}{2\sqrt{Dt}}$$

where $C$ is the carrier concentration of the N-type region $Co$ is the P-type carrier concentration at the surface of the epitaxial layer $X$ is the diffusion depth of the P-type region $D$ is the diffusion coefficient of the P-type dopant material $t$ is the time of diffusion, and $$\frac{X}{2\sqrt{Dt}} \text{ is between 1.8 and 3.1}$$

The thickness of the P-type region may be between 4 and 12 microns depending on the carrier concentration of the P-type dopant material at the surface of the epitaxial layer. The avalanche diode 10 can generate RF powers of 100 watts with efficiencies of 25 percent to 40 percent at L-band frequencies and about 50 watts at 10 percent efficiency at S-band and C-band frequencies.

Figure 2:
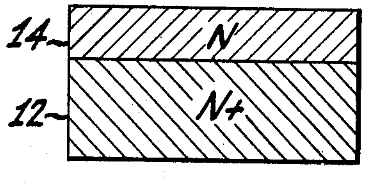
FIGS. 2—4 are sectional views showing the steps of one method of making the avalanche diode.
Figure 3:
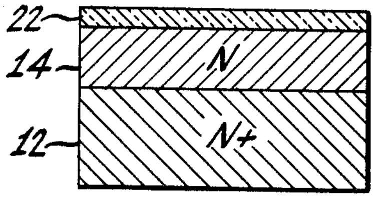
Figure 4:
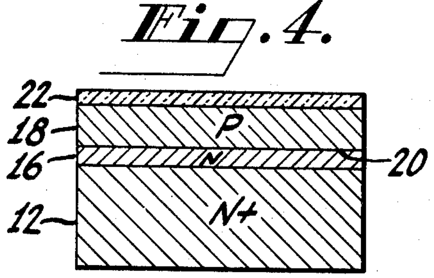

Referring to FIGS. 2—4 there is shown one method of making the avalanche diode 10. For this method one starts with a substrate 12 of heavily doped, a carrier concentration of approximately $10^{18}$cm.$^{13}$, N+-type semiconductor material, such as silicon, having on a surface thereof an epitaxial layer 14 of N-type semiconductor material, such as silicon, which has a carrier concentration of between $7\times10^{14}$cm.$^{13}$ and $1\times10^{15}$ cm.$^{13}$ (See FIG. 2). The substrate is of a thickness between 2 to 5 mils and the epitaxial layer 14 is relatively thick, approximately 20 microns. A layer 22 of a material containing a high concentration of P-type dopant, a carrier concentration for the order of $10^{19}$ to $10^{20}$cm.$^{13}$, is then applied to the surface of the epitaxial layer 14 as shown in FIG. 3. For example, if the P-type dopant is boron, the layer 22 may be of boron silicate or boron nitride. A boron silicate layer 22 may be applied by pyrolytically decomposing a gas containing boron and silicon, such as a mixture of trimethylborate and ethyl silicate, to deposit boron silicate on the surface of the epitaxial layer. A boron nitride layer 22 may be obtained by placing a disk of boron nitride next to the epitaxial layer in a sealed chamber and heating to evaporate the boron nitride and deposit it on the epitaxial layer.

Figure 9:
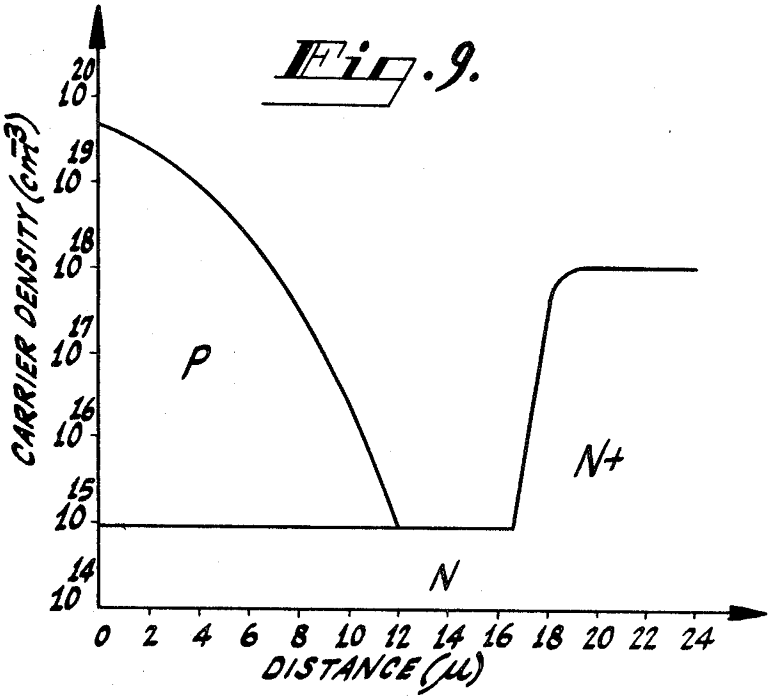
FIGS. 9 and 10 are doping profiles of two avalanche diodes made by the methods of the present invention.

The device is then heated to diffuse the P-type dopant, such as boron, from the layer 22 into the epitaxial layer 14 to provide a P-type region 18 over the N-type region 16 with a PN junction 20 therebetween as shown in FIG. 4. The diffusion is carried out at a temperature and for a time period such that the P-type dopant will diffuse in accordance with the expression previously stated to a depth of between 3 and 8 microns from the surface of the substrate 12. For example, with a carrier concentration of the P-type dopant, boron, in the layer 22 being approximately $10^{20}$cm.$^{13}$ and the carrier concentration in the epitaxial layer of N-type silicon being approximately $9\times10^{14}cm^{-3}$, a diffusion at a temperature of 1150°C for 15 hours will diffuse the P-type dopant approximately 12 microns into the epitaxial layer 14. The heating of the device also causes some back diffusion between the N+-type substrate 12 and the N-type epitaxial layer 14 so as to provide the graded N-type region at the surface of the substrate. Thus, this method produces an avalanche diode 10 having a concentration profile as shown in FIG. 9 which includes a deep diffused graded P-type region, a relatively thin N-type region of uniform carrier concentration and a graded N-type region to the N+-type substrate. Having a deep diffused P-type region provides the advantage of a uniform microplasma free PN junction which is essential for avalanche diodes which operate at a high avalanche current-density level. After the P-type dopant is diffused into the epitaxial layer 14, the layer 22 is removed, either by grinding or chemically etching, and metal contacts, not shown, can be applied to the surface of the P-type region 18 and the N+-type substrate 12.

Figure 5:
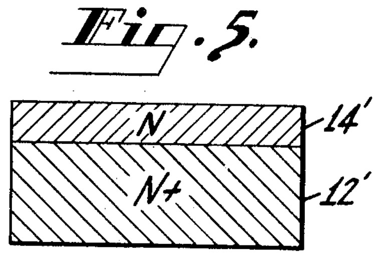
FIGS. 5—8 are sectional views showing the steps of another method of making the avalanche diode.
Figure 6:
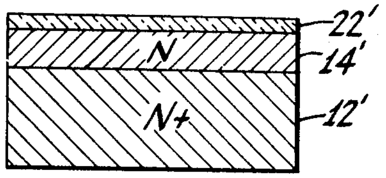

Referring to FIG. 5—8, there is shown another method of making the avalanche diode 10. For this method one starts with a substrate 12' of heavily doped, a carrier concentration of approximately $10^{18}$cm.[13], N+-type semiconductor material, such as silicon, having on a surface thereof an epitaxial layer 14' of an N-type semiconductor material, such as silicon, having a carrier concentration of between $7\times10^{14}$cm.[13] and $1\times10^{15}cm^{-3}$ as shown in FIG. 5. The substrate is of a thickness of between 2 to 5 mils and the epitaxial layer is of a thickness of approximately 10 microns. As shown in FIG. 6, a layer 22' of a material containing a high concentration of P-type dopant, a carrier concentration in the order of $10^{19}$ to $10^{20}$cm.[13], is applied to the surface of the epitaxial layer 14'. The layer 22' may be of the same material and applied in the same manner as the layer 22 in the method of FIGS. 2—4 previously described.

Figure 7:
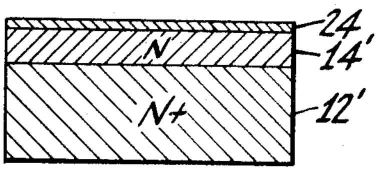
Figure 8:
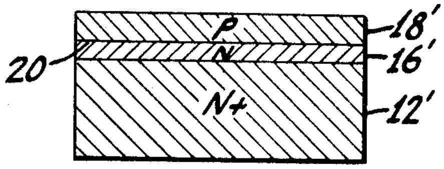
Figure 10:
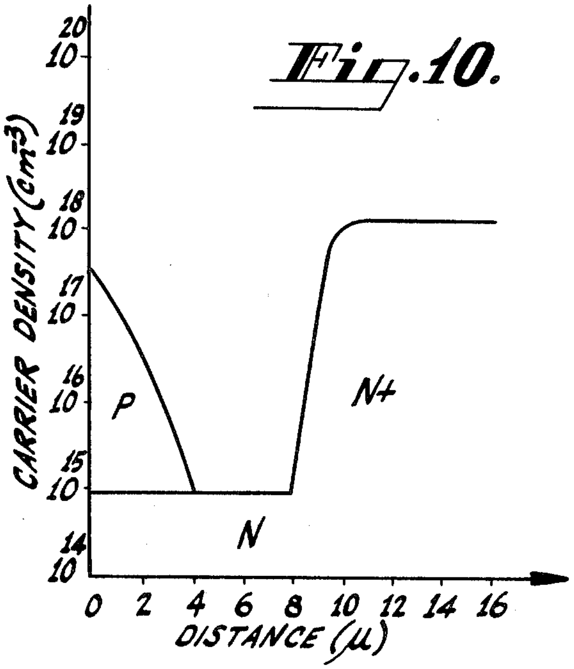

The device is then heated for a short period of time, such as, a minute to diffuse the P-type dopant a short distance into the epitaxial layer 14'. This provides a thin, highly doped P-type region 24 at the surface of the epitaxial layer 14' as shown in FIG. 7. Also as shown in FIG. 7, the layer 22' is then removed, such as by mechanical grinding or chemical etching. The device is then heated again to diffuse the P-type dopant in the region 24 further into the epitaxial layer 14 to provide a P-type region 18' over the N-type region 16' with a PN junction 20' therebetween as shown in FIG. 8. This diffusion is carried out at a temperature and for a time period such that the P-type dopant will diffuse in accordance with the expression previously stated to a depth of between 3 and 8 microns from the surface of the substrate 12'. For example, with a carrier concentration of the P-type dopant, boron, in the region 24 being approximately $4\times10^{17}$cm.[13] and the carrier concentration in the epitaxial layer of N-type silicon being approximately $9\times10^{14}cm.^{-3}$, a diffusion at a temperature of 1150° C. for about 2 hours will diffuse the P-type dopant approximately 4 microns into the epitaxial layer 14'. As in the method previously described, the heating of the device also causes some back diffusion between the N+-type substrate 12' and the N-type epitaxial layer 14' so as to provide a portion of graded carrier concentration between the substrate and the N-type region. Thus, this method produces an avalanche diode 10 having a concentration profile as shown in FIG. 10 which includes a shallow diffused, graded P-type region, a relatively thin N-type region of uniform carrier concentration and a graded N-type region to the N+-type substrate. Although the P-type region is shallow, by comparing the concentration profiles of FIGS. 9 and 10, it can be seen that the carrier concentration grading in the P-type region is the same as the grading achieved by the deep diffusion method of FIGS. 2—4. Thus, the avalanche diode made by this method will function in the same manner as the diode formed by the deep diffusion method. However, the avalanche diode 10 having a shallow diffused P-type region has an advantage which arises from having the PN junction close to the surface of the P-type region. These avalanche diodes are generally mounted with the contact of the P-type region being mounted on a heat sink. Since the PN junction is closer to the heat sink, because of the thinness of the P-type region, any heat generated in the diode will be more readily dissipated so as to achieve a cooler operating diode.

What we claim is:

1. An avalanche diode capable of generating high RF power at microwave frequencies comprising a substrate of N+-type semiconductor material of high carrier concentration, an epitaxial layer of a semiconductor material on a surface of said substrate, said epitaxial layer having therein a P-type region and an N-type region forming a PN junction therebetween with the N-type region being adjacent the said surface of the substrate and the P-type region extending completely along the surface of the epitaxial layer, the N-type region being of a thickness of approximately 3 to 8 microns, the P-type region being of a thickness of approximately 4 to 12 microns and having a carrier concentration which increases from the PN junction to the surface of the epitaxial layer according to the expression $$C = Co \operatorname{erfc} \frac{X}{2\sqrt{Dt}}$$

where $C$ is the carrier concentration of the N-type region and is between $7\times10^{14}$cm.[13] and $1\times10^{15}$cm.[13]

$Co$ is the P-type carrier concentration at the surface of the epitaxial layer $X$ is the depth of the P-type region $D$ is the diffusion coefficient of the P-type dopant material $t$ is the time of the diffusion of the P-type dopant material and, $\frac{X}{2\sqrt{Dt}}$ is between 1.8 and 3.1 with the lowest value being used for the thinnest P-type region and the highest value being used for the thickest P-type region.

2. A high power avalanche diode in accordance with claim 1 in which the substrate has a carrier concentration of approximately $10^{18}$cm.[13] and is of a thickness of between 2 to 5 mils.

3. A high power avalanche in accordance with claim 2 including a thin portion of the epitaxial layer at the surface of the substrate which has a carrier concentration which is graded between that of the substrate and that of the N-type region.

4. A high power avalanche diode in accordance with claim 3 in which the P-type carrier concentration at the surface of the epitaxial layer is approximately $10^{20}$cm.[13] and the P-type region is approximately 12 microns thick.

5. A high power avalanche diode in accordance with claim 3 in which the P-type carrier concentration at the surface of the epitaxial layer is approximately $10^{17}$cm.[13] and the P-type region is approximately 4 microns thick.

UNITED STATES PATENT OFFICE
CERTIFICATE OF CORRECTION

Patent No. 3,600,649 Dated August 17, 1971

Inventor(s) Shing-Gon Liu et al.

It is certified that error appears in the above-identified patent and that said Letters Patent are hereby corrected as shown below:

Column 1, line 40, column 2, lines 11, 14, 45, 48, 49, 53 and 73; column 3, lines 22, 25, 31 and 50; claim 1, line 20; claim 2, line 3; claim 4, line 3; and claim 5, line 3, "$cm^{13}$", each occurrence, should read -- $cm^{-3}$ --.

Signed and sealed this 14th day of March 1972.

(SEAL)
Attest:

EDWARD M.FLETCHER,JR.
Attesting Officer

ROBERT GOTTSCHALK
Commissioner of Patents

ORM PO-1050 (10-69)

USCOMM-DC 60376-P69
☆ U.S. GOVERNMENT PRINTING OFFICE : 1969 O—366-334